United States Patent [19]
Enomoto et al.

[11] Patent Number: 5,963,827
[45] Date of Patent: *Oct. 5, 1999

[54] METHOD FOR PRODUCING VIA CONTACTS IN A SEMICONDUCTOR DEVICE

[75] Inventors: Yoshiyuki Enomoto; Hiroshi Sata, both of Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/475,762

[22] Filed: Jun. 7, 1995

Related U.S. Application Data

[62] Division of application No. 08/223,872, Apr. 6, 1994, abandoned.

[30] Foreign Application Priority Data

| Apr. 6, 1993 | [JP] | Japan | 5-101838 |
| Jul. 30, 1993 | [JP] | Japan | 5-207000 |

[51] Int. Cl.$^6$ .................................................. H01L 21/28
[52] U.S. Cl. ........................ 438/629; 438/647; 438/648; 438/672
[58] Field of Search ...................... 437/189, 190, 437/192, 195; 257/751, 763, 764; 438/643, 648, 647, 625, 627, 628, 629, 644, 653, 654, 656, 672

[56] References Cited

U.S. PATENT DOCUMENTS

| 4,884,123 | 11/1989 | Dixit et al. | 257/751 |
| 4,924,295 | 5/1990 | Küecher | 257/751 |
| 4,983,543 | 1/1991 | Sato et al. | 438/630 |
| 4,994,410 | 2/1991 | Sun et al. | 438/649 |
| 5,035,768 | 7/1991 | Mu et al. | 156/626 |
| 5,200,360 | 4/1993 | Bradbury et al. | 438/675 |
| 5,202,579 | 4/1993 | Fujii et al. | 257/751 |
| 5,290,731 | 3/1994 | Sugano et al. | 438/635 |
| 5,305,519 | 4/1994 | Yamamoto et al. | 29/852 |
| 5,312,772 | 5/1994 | Yokoyama et al. | 438/643 |
| 5,326,404 | 7/1994 | Sato | 118/723 |
| 5,419,822 | 5/1995 | Dakesian et al. | 204/192.3 |
| 5,472,912 | 12/1995 | Miller | 438/643 |

FOREIGN PATENT DOCUMENTS

| 2-83978 | 3/1990 | Japan | 257/915 |
| 3-292765 | 12/1991 | Japan | 257/752 |

OTHER PUBLICATIONS

Japanese Abstract, "Manufacture of Semiconductor Device", 3–292765, Dec. 24, 1991 and translation.
Japanese Abstract, "Semiconductor Device", 2–83978, Mar. 26, 1990.
I. J. Raaijmakers et al., "Contact Hole Fill with Low Temperature LPCV TiN," VMIC Conference, Jun. 12–13, 1990, pp. 219–225.
D.S. Williams et al., "Nitrogen, oxygen and argon incorporation during reactive sputter deposition of titanium nitride", J. Vac. Sci. Technol. B 5(6), Nov./Dec. 1987, American Vacuum Society, pp. 1723–1729.

*Primary Examiner*—T. N. Quach
*Attorney, Agent, or Firm*—Hill & Simpson

[57] ABSTRACT

To provide a method for producing the semiconductor device in which contactability between a dielectric layer and a contact layer is not reduced during the formation of a metal plug, the method comprises forming a semiconductor device including a base; forming a lower conductive layer on the base; forming a dielectric layer formed on the lower conductive layer; forming an opening in the dielectric layer for electrically connecting the lower conductive layer with an upper conductive layer to be formed on the dielectric layer; forming a first contact layer formed on at least a bottom surface of the via hole and made of a single TiON layer, any portions of said first contact layer formed on the dielectric layer being removed; forming a second contact layer over an entire exposed surface of the first contact layer, depositing tungsten on the second contact layer by a chemical vapor deposition method; and removing portions of the second contact layer formed on the dielectric layer while leaving a tungsten plug and the first and second contact layers within the opening to form a via hole contact.

2 Claims, 9 Drawing Sheets

METHOD FOR PRODUCING VIA CONTACTS IN A SEMICONDUCTOR DEVICE

This is a division, of application Ser. No. 08/223,872, filed Apr. 6, 1994, abandoned.

BACKGROUND OF THE INVENTION

The present invention relates to a semiconductor device whose connection holes such as via holes or contact holes have characteristic features and a method for producing the semiconductor device. More particularly, the present invention relates to a semiconductor device whose connection holes such as via holes or contact holes produced through a so-called tungsten blanket CVD method have characteristic features and a method for producing the same semiconductor device.

Recently, integration and performance of semiconductor devices have been higher and higher in VLSI circuits and ULSI circuits, and hence a ration occupied by a wiring portion in each semiconductor device tends to be increased. Accordingly, multi-layer wiring becomes a necessary technique in order to prevent an increase in the semiconductor element area. In the semiconductor devices, via holes in which wiring material is embedded are formed to connect the multi-wiring layers with each other. Otherwise, contact holes in which wiring material is embedded are formed to connect an impurity material diffusion region formed on a semiconductor substrate and an upper conductive region with each other.

In semiconductor integrated circuits such as next generation or even later ultra-super LSI circuits, fineness and integration are remarkably advanced. An opening diameter of via holes or contact holes (hereinafter referred to as connection holes) is smaller and smaller down to, for example, 0.35 μm. As the opening diameter becomes smaller, it becomes impossible to form the connection holes with a high reliability by a conventional sputtering method which uses aluminum or aluminum alloy (hereinafter r referred to as an Al system alloy) in view of step coverage problems.

A so-called blanket CVD method is noticed in which a dielectric layer is formed on an impurity material diffusion region, respective electrodes or a lower wiring layer formed on a semiconductor substrate (these layers are sometimes called collectively a lower conductive layer), and conductive material is embedded in opening portions formed in these dielectric layers to form fine connection holes. More specifically, the blanket CVD method provides that, for example, after a tungsten layer made of tungsten has been precipitated by a CVD method, the tungsten layer formed on the dielectric layer is removed through etching so that metal plugs are formed in the opening portions to complete the connection holes. This methods will be hereinafter referred to as a tungsten blanket method.

In the case where the tungsten layer is formed by the tungsten blanket CVD method, it is necessary to form a contact layer under the tungsten layer. The reason for this is that the tungsten layer formed by the tungsten blanket CVD method is superior in step coverage but inferior in contactability to the dielectric layer. Also, it is necessary to prevent metallic fluoride gas such as $WF_6$ that is used as a raw material gas to form the tungsten layer from eroding the lower conductive layer. Furthermore, since the formation of the tungsten layer by the blanket CVD method is carried out at a relatively high temperature, it is necessary to enhance the barrier property to the lower conductive layer.

For those reasons, it is necessary to form between the tungsten layer and the dielectric layer a contact layer made of Ti layer/TiN layer or Ti layer/TiON layer and the like. In this case, the TiN layer or TiON layer is formed on the Ti layer.

Figure 1A:
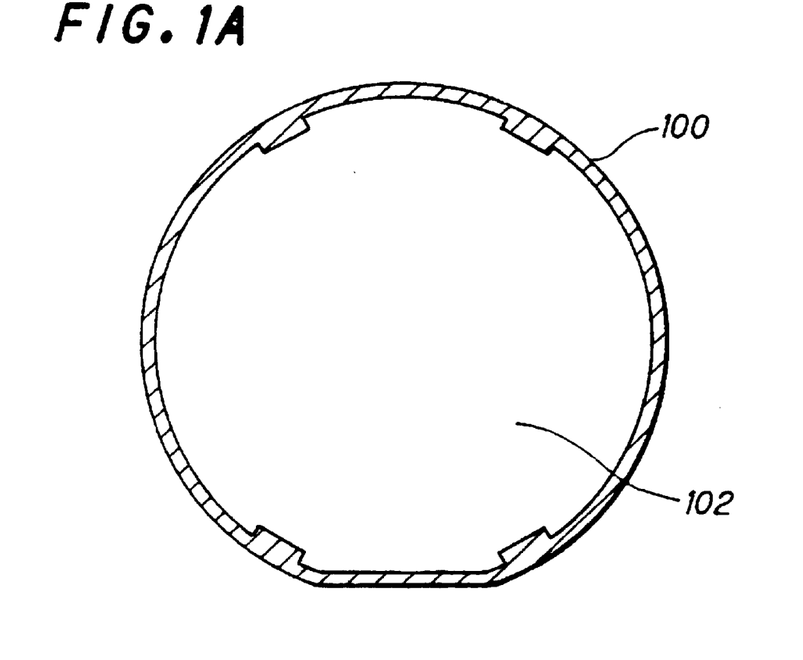
FIG. 1A is a schematic plan view showing a state of formation of a contact layer on a substrate after sputtering.

Presently, the contact layer has been produced through a sputtering method. When the contact layer is formed by the sputtering method, it is necessary to fix the semiconductor substrate onto a substrate support table by using a retainer jig. The retainer jig is in general used to retain the semiconductor substrate under the condition that edge portions of the semiconductor substrate are covered by the jig. Accordingly, the contact layer is not formed on portions of the semiconductor substrate which are retained by the jig. FIG. 1A is a schematic plan view showing a semiconductor substrate on which the contact layer is formed by the sputtering method. In FIG. 1A, there are shown the semiconductor substrate 100 and the contact layer 102. A hatching is applied to the region where no contact layer is formed.

In the case where the tungsten layer is formed by the tungsten blanket CVD method, if the tungsten layer is formed on the region of the dielectric layer where te contact layer is not formed, the tungsten layer is liable to be separated from the contact-free region. For this reason, when the tungsten layer is formed, it is not applied to the region of the dielectric layer where the contact layer has not been formed due to the covering jig. The covering jig covers not only the contact-free region of the dielectric layer but also a part of the dielectric layer where the contact layer is formed. Thios condition is shown in a schematic plan view of FIG. 1B. The covering jig is shown by reference numeral 104 in FIG. 1B.

When the tungsten layer is formed by the tungsten blanket CVD method by using such a covering jig, there is a problem that the contact layer on the portion which is covered by the covering jig would by separated from the dielectric layer. This problem would be caused by the following phenomena.

Namely, in the tungsten blanket CVD method, first of all, $WF_6$ and $SiH_4$ are used as a raw material gas at a low pressure and a tungsten nuclear material layer is formed on a dielectric layer and in an opening portion by utilizing the reduction reaction of $SiH_4$. Incidentally, this process (hereinafter referred to as a nucleation step) is carried out in order to improve a film thickness uniformness of the tungsten layer on the contact layer. In the nucleation step, the tungsten nuclear material is sufficiently formed on a part of the contact layer that is not covered by the covering jig. However, the low pressure raw material gas is kept at a low pressure, the raw material gas is hardly introduced on to the part of the contact layer that is covered by the covering jig. As a result, little or no tungsten nuclear material is formed on the part of the contact layer that is covered by the covering jig so that the part of the contact layer is exposed.

Subsequently to the nucleation step, the tungsten layer is formed on the tungsten nuclear material and in the opening portion by using high pressure $WF_6$ and $H_2$ as the raw material gas by utilizing the reduction reaction of $H_2$. This process will be referred to as a high speed growth step. In the region where the tungsten nuclear material is sufficiently formed and is not covered by the covering jig, $WF_6$ is immediately reduced by $H_2$ to form the tungsten layer. On the other hand, since the pressure of the raw material gas is high, the raw material gas is introduced also onto the part of the contact layer that is covered by the covering jig.

Figure 2:
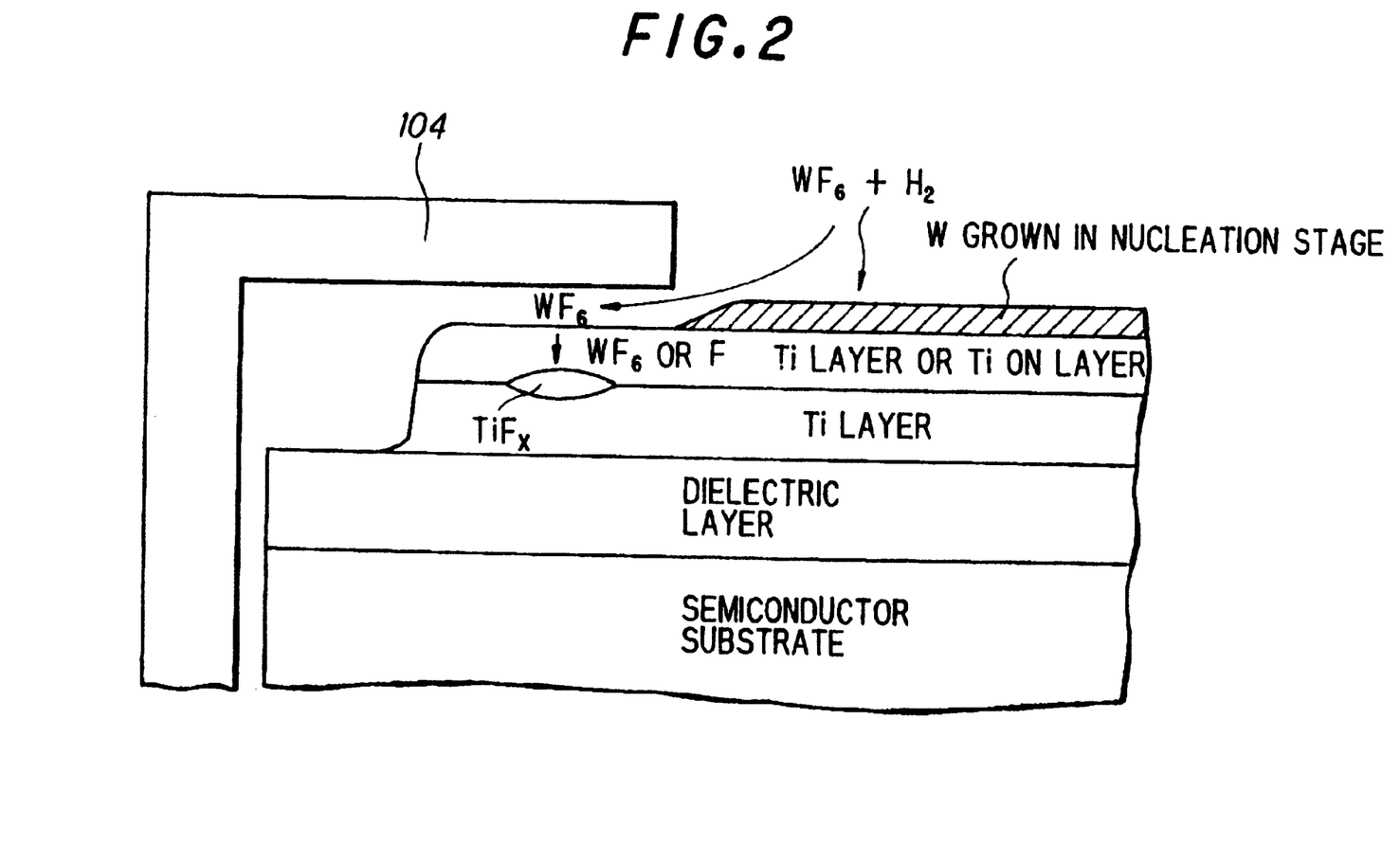
FIG. 2 is a schematic cross-sectional view showing a separation mechanism of the contact layer away from the dielectric layer.

However, since the tungsten nuclear material is not formed on the part of the contact layer that is covered by the covering jig, $WF_6$ or F generated by the decomposition of $WF_6$ is reacted with i contained in the i layer that forms the contact layer, before the adsorption separation between $WF_6$ and $H_2$ adsorbed on the contact layer. The $WF_6$ or F is reacted with Ti contained in the Ti layer that forms the contact layer, thereby forming $TiF_x$. As a result of the formation of $TiF_x$, the layer separation occurs between the Ti layer and TiN layer or TiON layer. As a result, there is a problem that the contact layer is separated from the dielectric layer. FIG. 2 is a schematically enlarged cross-sectional view showing such a mechanism. Incidentally, in FIG. 2, a gap between the covering jig 104 and the contact layer surface is depicted in an exaggerated manner.

Presently, in order to cope with such a separation of the contact layer, a RTA process (Rapid Thermal Annealing) is carried out at a temperature of about 900° C. for thirty minutes in a nitrogen gas atmosphere before the tungsten blanket CVD method is carried out and after the contact layer is formed through the sputtering method. through the RTA process, the Ti contained in the i layer is reacted to be TiN so that the TiN layer or TiON layer may suppress the diffusion of $WF_6$ or F.

However, there is a problem that a crack would be generated in the contact layer depending upon the kind of the dielectric layer used upon the RTA process. Also, in the case where the lower conductive layer is made of Al system alloy, since the Al system alloy is molten, it would be impossible to carry out the RTA process itself. Furthermore, when the RTA process is carried out, the contact resistance between the connection holes and the lower conductive layer would be increased, or the contact between the connection holes and the lower conductive layer would exhibit the non-ohmic characteristics.

SUMMARY OF THE INVENTION

Accordingly, an object of the present invention is to provide a semiconductor device having a structure interposed between a dielectric layer and a contact layer for avoiding a contactability and to provide a method for producing the same.

In order to attain this and other objects, according to a first aspect of the invention, there is provided a semiconductor device comprising: a base; a lower conductive layer formed on the base; a dielectric layer formed on the lower conductive layer; a via hole formed in the dielectric layer for electrically connecting the lower conductive layer with an upper conductive layer to be formed on the dielectric layer; a contact layer formed on at least a bottom surface of the via hole and made of titanium system material selected from the group essentially consisting of TiN and TiON; and a tungsten plug deposited in an interior of the via hole.

In the semiconductor device according to the first aspect of the invention, the lower conductive layer may be made of aluminum and/or aluminum alloy. In this case, it is preferable that a conductive layer made of one material selected from the group essentially consisting of Ti, TiON and TiW is formed on the lower conductive layer.

In order to produce the semiconductor device according to the first aspect of the invention, there is provided a method for producing the semiconductor device according to the first aspect of the invention, comprising the following steps of:

forming a dielectric layer on a base on which a first conductive layer is formed;

forming an opening portion in the dielectric layer;

forming a contact layer, made of a titanium system material, on the dielectric layer and in an interior of the opening portion;

depositing a tungsten layer on the contact layer through a chemical vapor deposition method; and removing the tungsten layer and the contact layer from the dielectric layer and leaving a tungsten plug and a part of the contact layer in the interior of the opening portion to form a via hole contact.

The method may further include the step of forming a second conductive layer, made of one material selected from the group essentially consisting of Ti, TiON and TiW, on the first conductive layer before forming the dielectric layer. Also, it is preferable to form the contact layer through a sputtering method.

In order to produce the semiconductor device according to the first aspect of the invention, there is provided a method for producing the semiconductor device according to a second aspect of the invention, wherein the step of forming the contact layer comprises the following steps of: depositing a first contact layer having a thickness of 6 nm or less on the dielectric layer and in the opening portion by a sputtering method using titanium as a target under an argon gas atmosphere; and forming a single layered contact layer by depositing a second contact layer on the first contact layer by a sputtering method using titanium as a target under an atmosphere containing at least nitrogen gas, and at the same time nitrating the first contact layer.

In the method for producing the semiconductor device according to the second aspect of the invention, the lower conductive layer may be made of aluminum and/or aluminum alloy.

In order to attain above-described and other objects according to the second aspect of the invention, there is provided a semiconductor device comprising: a base; a lower conductive layer formed on the base; a dielectric layer formed on the lower conductive layer; a via hole formed in the dielectric layer for electrically connecting the lower conductive layer with an upper conductive layer to be formed on the dielectric layer; a contact layer made of a first contact layer and a second contact layer formed on the first contact layer and formed on at least a bottom surface of the via hole and made of a titanium system material; and a tungsten plug deposited in an interior of the via hole.

In the semiconductor device according to the second aspect of the invention, it is preferable that the first contact layer is made of Ti layer/TiN layer or Ti layer/TiON layer, and the second contact layer is made of tungsten or silicon. Also, as another modification, the first contact layer may be made of a single layered TiON or as a two-layer structure composed, from the lower side, of a Ti layer/TiON layer and the second contact layer may be made of TiN.

In order to produce the semiconductor device according to the second aspect of the invention, there is provided a method for producing the semiconductor device according to a third aspect of the invention, comprising the following steps of:

forming a dielectric layer on a base on which a first conductive layer is formed;

forming an opening portion in the dielectric layer;

forming a first contact layer on at least a bottom of the opening portion;

forming a second contact layer over an entire surface of the first contact layer;

depositing tungsten on the second contact layer by a chemical vapor deposition method; and removing the respective layers formed on the dielectric layer while leaving a tungsten plug and the first and second contact layers within the opening portion to thereby form a via hole contact.

In this method, the first contact layer has a two-layer structure composed, from the lower side, of one of a Ti layer/TiN layer and a Ti layer/TiON layer. The first contact layer is formed over the entire surface in the step of forming the first contact layer, and the first contact layer is made of tungsten and/or silicon. Otherwise, the first contact layer has a single TiON layer through a sputtering method or a two-layer structure made, from the lower side, of the Ti layer/TiON layer through the sputtering method, the step of forming the first contact layer comprises the step of removing the first contact layer formed on the dielectric layer, and the second contact layer is formed by the sputtering method.

When the tungsten layer is formed for forming the tungsten plug, the contact failure resulting between the contact layer and the dielectric layer in the conventional technique is caused by the formation of $TiF_x$ between the Ti layer/TiN layer or the Ti layer/TiON layer as mentioned before. In the semiconductor device according to the first aspect of the invention and in the method for producing the semiconductor device according to the first aspect of the invention, since the contact layer is made into a single layer made of TiN or TiON, it is possible to effectively prevent such a contact failure.

In the method for producing the semiconductor device according to the first aspect of the invention, in the case where the lower conductive layer formed on the base is made of aluminum or aluminum alloy, when the contact layer is formed, the surface of the lower conductive layer exposed to the bottom of the opening portion is nitrated to sometimes increase the contact resistance. In the method for producing the semiconductor device according to the second aspect of the invention, the first contact layer having a thickness of 6 nm or less is deposited on the dielectric layer and in the opening portion under the argon gas atmosphere by using a sputtering method using titanium as a target, and subsequently, the second contact layer is deposited on the first contact layer under the atmosphere containing at least nitrogen gas by using a sputtering method using titanium as a target to thereby nitrate the first contact layer together to thereby form the single layered contact layer.

Since the deposition of the first contact layer is carried out in the argon gas atmosphere without using the nitrogen gas, the surface of the lower conductive layer is not nitrated, and it is possible to prevent the increase in contact resistance.

The first contact layer is nitrated when the second contact layer is formed to form a Ti-rich TiN (or TiON depending upon the film formation conditions). Since the second contact layer is composed of TiN (or TiON depending upon the film formation conditions), eventually, the first and second contact layers are formed into a single layer. Accordingly, when the tungsten layer is formed on the single layered contact layer for forming the tungsten plug, there is no fear that the contact failure between the contact layer containing a Ti layer and the dielectric layer would occur like in a conventional technique.

In the semiconductor device according to the second aspect of the invention or in the method for producing the semiconductor device according to the third aspect, the second contact layer is formed. In the case where such a second contact layer is formed of, for example, tungsten, when the tungsten layer is formed on the contact layer for forming the tungsten plug, the diffusion of F or $WF_6$ to the first contact layer formed on the dielectric layer is suppressed by the second contact layer that is made of tungsten until $WF_6$ and $H_2$ are reacted with each other. In the case where the second contact layer is formed of, for example, silicon, when the tungsten layer is formed on the contact layer for forming the tungsten plug, $WF_6$ is reacted with the silicon that constitutes the second contact layer to form W. As a result, the diffusion of F or $WF_6$ to the first contact layer formed on the dielectric layer is suppressed by the second contact layer made of silicon. Furthermore, in the case where the second contact layer is formed of, for example, TiN, if the first contact layer is removed before formation of the tungsten layer on the contact layer for forming the tungsten plug, the second contact layer is never separated away from the dielectric layer to thereby prevent the separation of the contact layer away from the dielectric layer as in the conventional technique.

DESCRIPTION OF THE PREFERRED EMBODIMENTS

The present invention will now be described with reference to the accompanying drawings.

Embodiment 1

Figure 3:
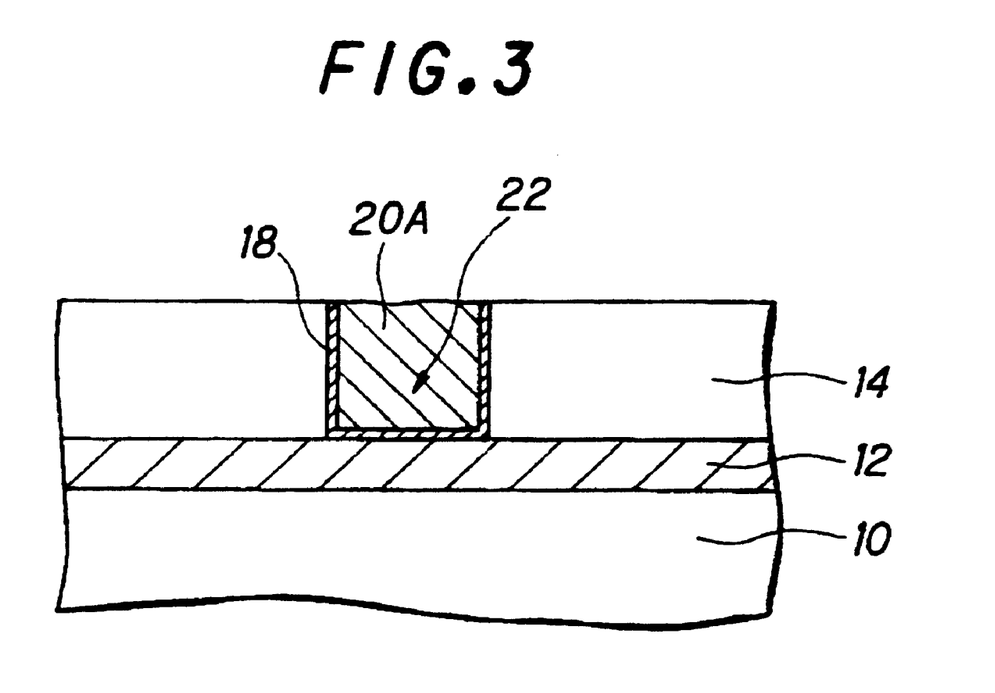
FIG. 3 is a schematic fragmentary cross-sectional view showing a connection hole in a semiconductor device according to a first embodiment of the present invention.
Figure 4A:
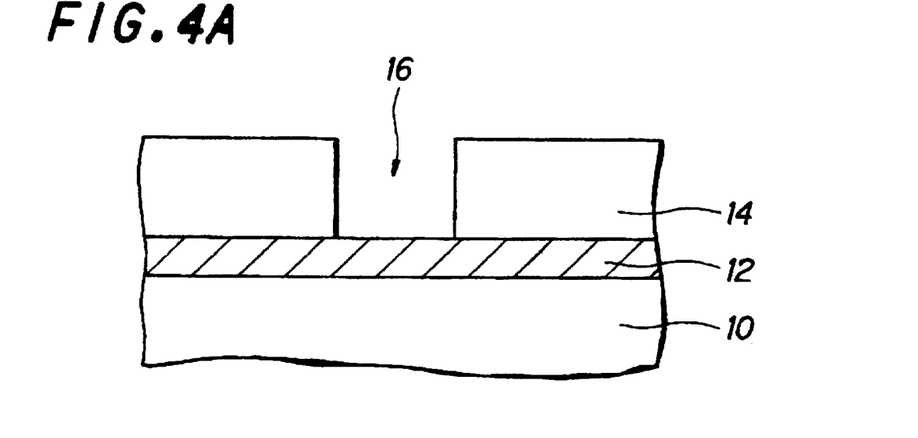
FIG. 4A is a schematic fragmentary cross-sectional view showing the semiconductor device in a first manufacture step for illustrating a method for producing the semiconductor device according to the first embodiment.
Figure 4B:
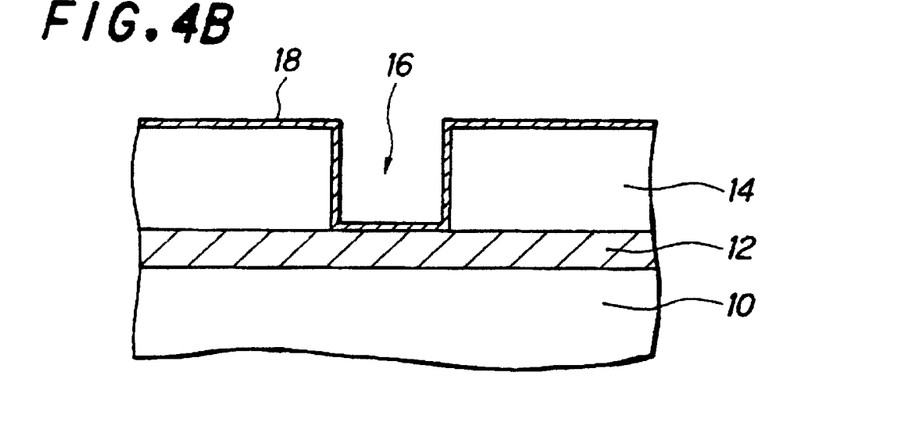
FIG. 4B is another schematic fragmentary cross-sectional view showing the semiconductor device in a second manufacture step for illustrating the method for producing the semiconductor device according to the first embodiment.

A first embodiment relates to a semiconductor device according to a first aspect of the present invention and also to a method for producing the semiconductor device according to the first aspect of the invention. FIG. 3 is a schematic fragmentary cross-sectional view showing the semiconductor device according to the first embodiment. The semiconductor device has a lower conductive layer 12 formed on a base 10, a dielectric layer 14 coating the lower conductive layer 12, and a connection hole 22 formed within the dielectric layer 14 for electrically connecting an upper conductive layer to be formed on the dielectric layer with the lower conductive layer 12. The connection hole 22 is composed of a single layer contact layer 18 made of TiN formed on a bottom surface of the connection hole and a tungsten plug 20A deposited within the connection hole. Incidentally, in the first embodiment, the contact layer 18 is also formed on a side wall of the connection hole 22. In the embodiment 1, the base 10 is an interlayer dielectric layer formed on a semiconductor substrate (not shown). The lower conductive layer 12 is sued specifically as an electrode or a wiring layer made of aluminum or aluminum alloy formed on the base 10. The method for producing the semiconductor device according to the first embodiment will now be described with reference to FIGS. 4A to 4C.

STEP 100

First of all, a dielectric layer 14 having a thickness 500 nm and made of $SiO_2$ is formed through, for example, a CVD method on the base 10 on which the lower conductive layer 12 has been formed. Subsequently, an opening portion 16 is formed on the dielectric layer 14 on the lower conductive layer 12 through, for example, a photo-lithography and a reactive ion etching (RIE) (see FIG. 4A).

STEP 110

Thereafter, a single layer contact layer 18 made of TiN on the dielectric layer 14 and in the opening portion 16 is formed by, for example, a sputtering method (see FIG. 2B). For example, the conditions for sputtering are given as follows:

Target: Ti
Gas Used: nitrogen gas
Gas Pressure: 1.1 Pa (8 mTorr)
Power: 6 kW

The contact layer is formed by sputtering in a region of the base 10 (the substrate 100) as shown in FIG. 1A.

STEP 120

Figure 1B:
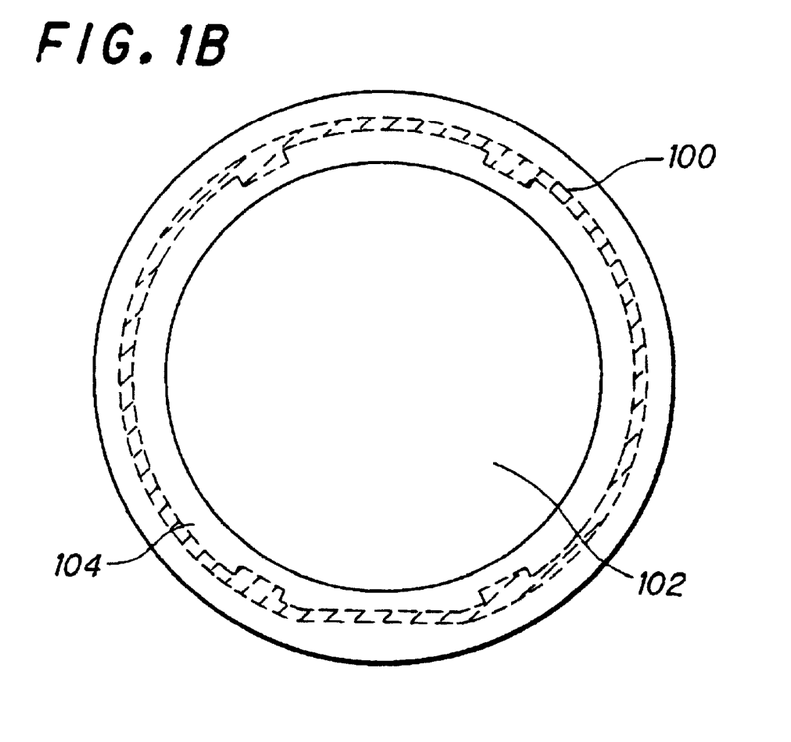
FIG. 1B is a schematic plan view showing the extent of coverage of the contact layer by a covering jig during a CVD method.
Figure 4C:
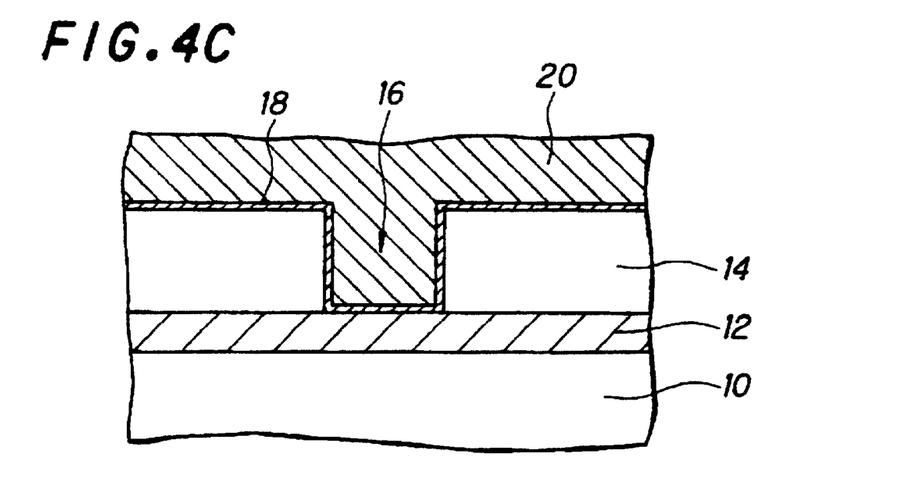
FIG. 4C is still another schematic fragmentary cross-sectional view showing the semiconductor device in a third manufacture step for illustrating the method for producing the semiconductor device according to the first embodiment.

Subsequently, a tungsten layer 20 is deposited through a chemical vapor deposition on the contact layer 18 including in the opening portion 16 (see FIG. 4C). The tungsten layer 20 is formed by a blanket tungsten CVD method. At this time, the region of the base where the contact layer was not formed is covered by covering jig. As shown in FIG. 1B, not only the region of the base where the contact layer was not formed but also a part of the base where the contact layer is formed are covered by the covering jig. For instance, the conditions for the blanket tungsten CVD method are given as follows:

First Step (Nucleation Step)

$WF_6/SiH_4/Ar$ = 5/3/2000 sccm
Pressure      $4 \times 10^2$ Pa (3 Torr)
Temperature      450° C.
Second Step (High Speed Growth Step)

$WF_6/H_2/Ar$ = 40/400/2250 sccm
Pressure      $1.1 \times 10^2$ Pa (0.8 Torr)
Temperature      450° C.

In the first step of the nucleation step, no or only very little tungsten nuclear material is formed on the region of the substrate that is covered by the covering jig including the area that is not covered by the contact layer. In the second step of the high speed growth step, since the tungsten nuclear material is not formed on the contact layer that is covered by the covering jig, $WF_6$ or F that has been generated by the decomposition of $WF_6$ is diffused in the TiN layer that forms the contact layer before the adsorption separation occurs between $WF_6$ and $H_2$ adsorbed on the contact layer. However, since the single layer contact layer is only formed on the dielectric layer, there is no fear that separation of the contact layer from the dielectric layer would occur.

STEP 130

Subsequently, the tungsten layer 20 and the contact layer 18 are removed from the dielectric layer 14 so that the tungsten plug 20A and the contact layer 18 are left in the opening portion 16 to form the connection hole 22. Parts of the tungsten layer 20 and the contact layer 18 may be left on the dielectric layer 14 as desired. Thus, the connection hole in the semiconductor device shown in FIG. 3 is produced. Furthermore, an upper conductive layer made of, for example, an Al system alloy is formed by the sputtering method or the like on the dielectric layer of the semiconductor device.

In the first embodiment, the single layer contact layer made of TiN is used or instead it is possible to use a single layer contact layer made of TiON.

Figure 5:
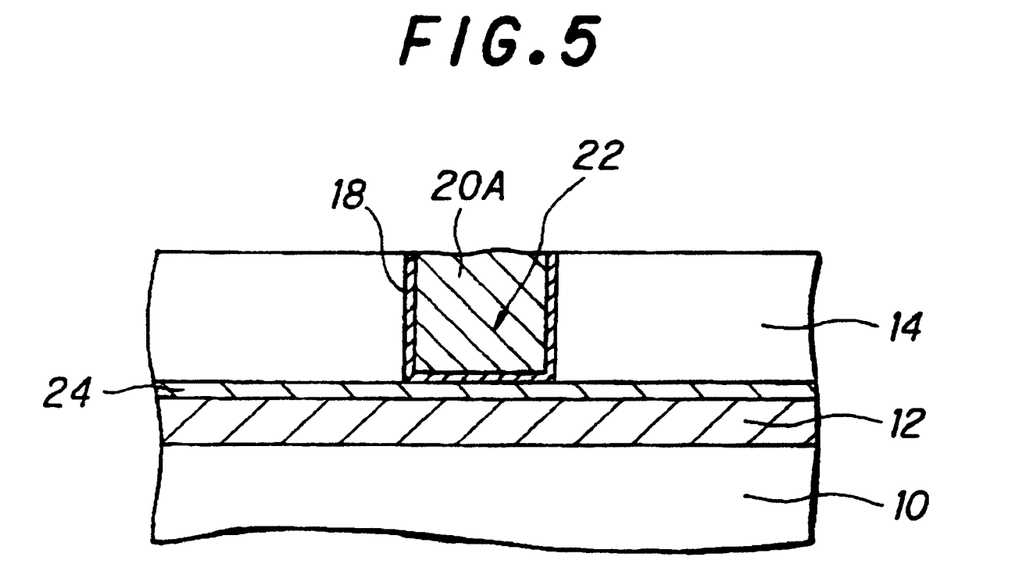
FIG. 5 is a schematic fragmentary cross-sectional view showing a connection hole in a semiconductor device according to a modification to the first embodiment.

As shown in FIG. 5, a conductive layer 24 made of TiN, TiON or TiW may be formed on the lower conductive layer 12. This conductive layer 24 may be formed by the sputtering method prior to the step 100. Namely, in the case where the lower conductive layer 12 is made of an Al system alloy, an Al system alloy layer is deposited on the base 10 by the sputtering method, and thereafter, the conductive layer 24 is formed on the Al system alloy layer by the sputtering method. Thereafter, the conductive layer 24 and the Al system alloy layer 12 are selectively removed, so that the lower conductive layer 12 and the conductive layer 24 which is formed on the lower conductive layer 12 are obtained. With such a structure, it is possible to reduce a contact resistance between the lower conductive layer 12 and the metal plug 20A.

Embodiment 2

In the first embodiment, the single layer contact layer 18 made of TiN on the dielectric layer 14 and the opening portion 16 is formed by the sputtering method under the nitrogen atmosphere. Accordingly, the surface of the lower conductive layer 12 which is made of aluminum and aluminum alloy and which is exposed to the bottom of the opening portion 16 is nitrated through nitrogen plasma. As a result, there are some cases that aluminum nitride (AlN) which is a dielectric is formed on the surface of the lower conductive layer 12 which will increase the contact resistance.

Embodiment 2 relates to a semiconductor device according to the first aspect of the invention and to a method for producing the semiconductor device according to a second aspect of the invention. The structure itself of the semiconductor device of the second embodiment schematically shown in FIG. 3. Namely, the semiconductor device has a lower conductive layer 12 formed on a base 10, a dielectric layer 14 coating the lower conductive layer 12, and a connection hole 22 formed within the dielectric layer 14 for electrically connecting an upper conductive layer to be formed on the dielectric layer with the lower conductive layer 12. The connection hole 22 is composed of a single layer contact layer 18 made of TiN formed on a bottom surface of the connection hole and a tungsten plug 20A deposited within the connection hole. Incidentally, in the first embodiment, the contact layer 18 is also formed on a side wall of the connection hole 22. In the embodiment 1, the base 10 is an interlayer dielectric layer formed on a semiconductor substrate (not shown). The lower conductive layer 12 is used specifically as an electrode or a wiring layer made of aluminum or aluminum alloy formed on the base 10.

In Embodiment 2, under the argon gas atmosphere, a first contact layer 18A having a thickness 6 nm or less is deposited by a sputtering method using titanium as a target, and furthermore a second contact layer 18A is formed on the first contact layer 18A under an atmosphere including at least nitrogen gas (for example, nitrogen gas only, a combination of nitrogen gas and argon gas or a combination of nitrogen gas, oxygen gas and argon gas or the like) by a sputtering method using titanium as a target to nitride the first and second contact layers 18A and 18B together to thereby form the contact layer 18. This point is distinct over the semiconductor producing method in accordance with the first aspect of the invention that has been explained in conjunction with the first embodiment.

Figure 6A:
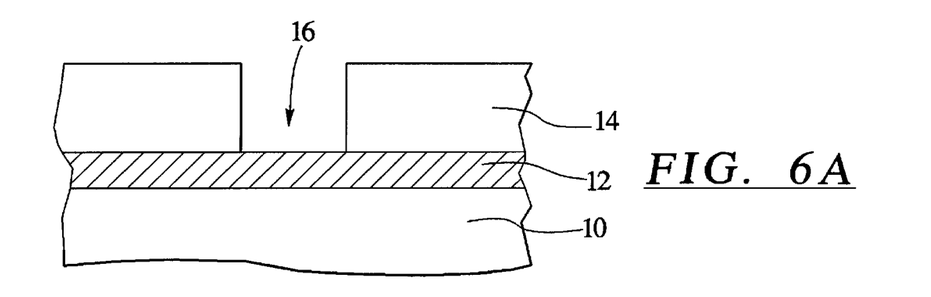
FIG. 6A is a schematic fragmentary cross-sectional view showing a semiconductor device in a first manufacture step for illustrating a method for producing the semiconductor device according to a second embodiment.

A method of producing a semiconductor device in accordance with the second embodiment will now be described with reference to FIGS. 6A to 6C.

STEP 200

First of all, in the same manner as in the step 100 of the first embodiment, a dielectric layer 14 having a thickness 500 nm and made of SiO2 is formed through, for example, a CVD method on the base 10 on which the lower conductive layer 12 has been formed. Subsequently, a opening portion 16 is formed on the dielectric layer 14 on the lower conductive layer 12 (see FIG. 6A).

STEP 210

Figure 6B:
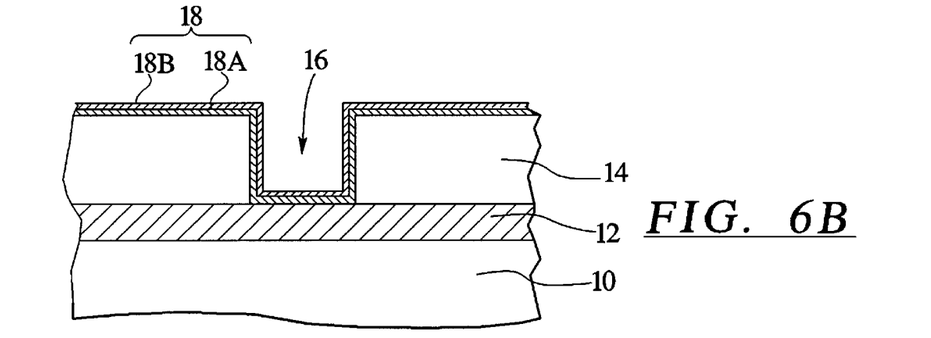
FIG. 6B is another schematic fragmentary cross-sectional view showing the semiconductor device in a second manufacture step for illustrating the method for producing the semiconductor device according to the second embodiment.
Figure 6C:
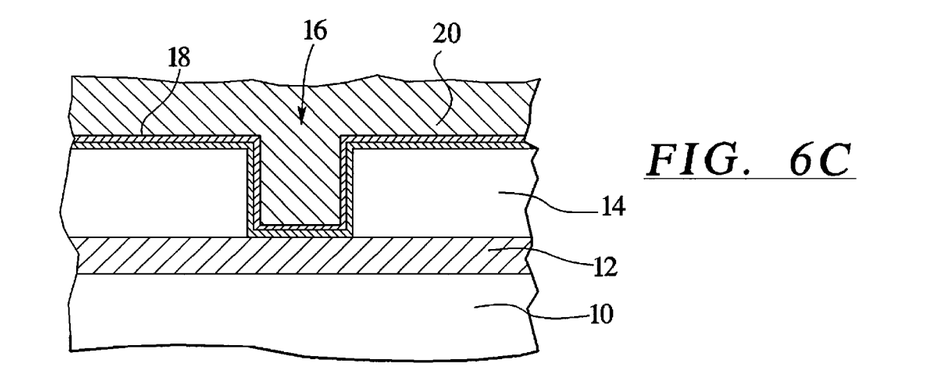
FIG. 6C is still another schematic fragmentary cross-sectional view showing the semiconductor device in a third manufacture step for illustrating the method for producing the semiconductor device according to the second embodiment.

Thereafter, under an argon gas atmosphere, a first contact layer 18A is deposited on the dielectric layer 14 and in the opening portion 16 by a sputtering method using titanium as a target (see FIG. 6B). For example, the conditions for sputtering are given as follows:

Target: Ti
Gas Used; argon gas
Gas Pressure: 0.5 Pa (4 mTorr)
Power: 1 kW
Film Forming Time: 4 secs.

The thickness of the first contact layer 18A is 6 nm on the dielectric layer 14. The sputtering method is carried out under the argon gas atmosphere without using the nitrogen gas, so that is possible to prevent the formation of nitride on the surface of the lower conductive layer 12 exposed to the bottom of the opening portion. As a result, it is possible to prevent an increase of the contact resistance.

The first contact layer 18A is composed of titanium including TiN (or TiON depending upon the film formation condition). Namely, usually, TiN is formed on the Ti surface that is a target, upon which material for the second contact layer 18B (which formation corresponds to the step 220 to be described later) has been previously formed. Upon the film formation of the first contact layer 18A, TiN on the target surface is emitted from the target surface and deposited on the dielectric layer 14 and the opening portion 16. In addition, Ti emitted from the target is also deposited on the dielectric layer 14 and the opening portion 16. Accordingly, the first contact layer 18A that is deposited on the dielectric layer 14 and the opening portion 16 is composed mainly of Ti and contains TiN (TiON depending upon the film formation condition).

STEP 220

Subsequently, under a nitrogen gas atmosphere, a second contact layer 18B is deposited on the first contact layer 18A by a sputtering method using titanium as a target (see FIG. 6B). For example, the conditions for sputtering are given as follows:

Target: Ti
Gas Used: nitrogen gas
Gas Pressure: 1.1 Pa (8 mTorr)
Power: 6 kW
Film Forming Time: 44 secs.

The thickness of the second contact layer 18B is 70 nm on the dielectric layer 14. The gas used may be nitrogen gas and argon gas in combination.

When the second contact layer 18B is formed, since the sputtering atmosphere is nitrogen gas, the first contact layer 18A is nitrated to form a ti-rich TiN. As a result, the first contact layer 18A and the second contact layer 18B are together made into a single layer to form a contact layer 18 made of TiN. With the above-described two-step sputtering method, the contact layer 18 that has been made into a single layer is formed in the region of the base shown in FIG. 1A. Accordingly, when the tungsten layer is formed onto the single layered contact layer for the formation of the tungsten plug, unlike the conventional technique, it is possible to prevent a serious problem of the contact failure between the contact layer made of Ti and the dielectric layer.

If the thickness of the first contact layer 18A would exceed 6 nm on the dielectric layer 14, a large amount of a Ti layer that does not contain TiN would be formed in step 210. Also, the first contact layer 18A would not be sufficiently nitrated in step 220 so that a large amount of pure titanium would be left in the first contact layer 18A. As a result, when the tungsten layer is formed on the contact layer for forming the next tungsten plug, the risk of contact failure would be increased between the contact layer and dielectric layer as occurs in the conventional technique.

STEP 230

Subsequently, a tungsten layer 20 is deposited by a chemical vapor deposition on the single layered contact layer 18 including in the opening portion 16 (see FIG. 6C). The tungsten layer 20 is formed by a blanket tungsten CVD method. At this time, the region of the base where the contact layer 12 has not been formed is covered by a covering jig. As shown in FIG. 1B, not only the region of the base where the contact layer is not formed but also a part of the base where the contact layer is formed are covered by the covering jig. For instance, the conditions for the blanket tungsten CVD method may be selected in the same way as in the first embodiment.

In the first step of the nucleation step, no or very little tungsten nuclear material is formed in the region of the substrate that is covered by the covering jig including the region not covered by the contact layer. In the second step of the high speed growth step, since the tungsten nuclear material is not formed on the contact layer that is covered by the covering jig, $WF_6$ or F that has been generated by the decomposition of $WF_6$ is diffused in the TiN layer that forms the contact layer before the adsorption separation occurs between $WF_6$ and $H_2$ adsorbed on the contact layer. However, since the single layer contact layer is only formed on the dielectric layer, there is no risk that the contact layer would be separated from the dielectric layer.

STEP 240

Subsequently, the tungsten layer 20 and the single layered contact layer 18 are removed from the dielectric layer 14 so that the tungsten plug 20A and the single layered contact layer 18 are left in the opening portion 16 to form the connection hole 22. Parts of the tungsten layer 20 and the contact layer 18 may be left on the dielectric layer 14 as desired. Thus, the semiconductor device shown in FIG. 3 is produced. Furthermore, an upper conductive layer made of, for example, Al system alloy is formed by the sputtering method or the like on the dielectric layer of the semiconductor device.

Under the condition that the thickness of the second contact layer 18B made of TiN is kept constant, the contactability between the contact layer and the dielectric layer and the contact resistance measurement results when the film thickness of the first contact layer 18A is changed on the dielectric layer 14 are shown as follows:

| thickness of first contact layer | contactability | contact resistance Ω |
|---|---|---|
| 0 nm | good | 226 |
| 6 nm | good | 1.6 |
| 12 nm | bad | — |
| 23 nm | bad | 1.3 |

In the second embodiment, the second contact layer 18B made of TiN is formed, or instead, the second contact layer made of TiON may be formed under the atmosphere of nitrogen gas, oxygen gas and argon gas. Also, instead of titanium as a target material, a metal material may be used that may be formed into a film through a sputtering method without nitrating a lower wiring layer made of aluminum or aluminum alloy, and that has electric conductivity even if nitrated and nitrides having durability against $WF_6$ or F.

Embodiment 3

Figure 7:
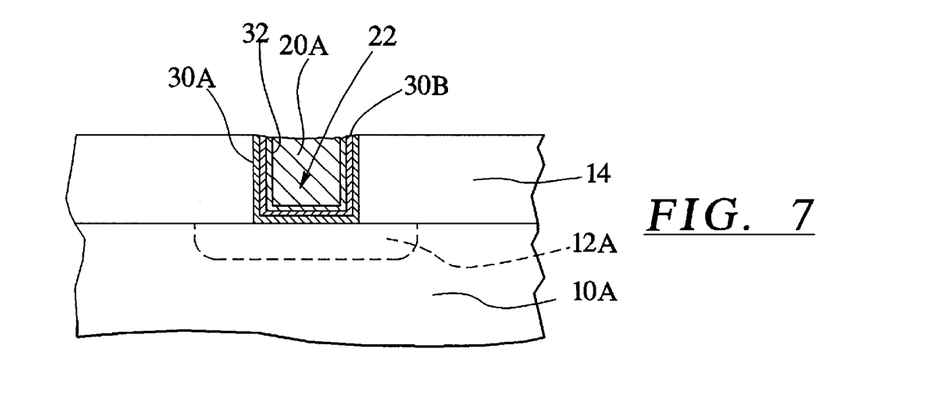
FIG. 7 is a schematic fragmentary cross-sectional view showing a connection hole in a semiconductor device according to a third embodiment.

A third embodiment relates to a semiconductor device according to the second aspect of the present invention and also to a method for producing the semiconductor device according to a third aspect of the invention. FIG. 7 is a schematic partial cross-sectional view showing the semiconductor device according to the third embodiment. The semiconductor device has a lower conductive layer 12A formed on a base 10A, a dielectric layer 14 coating the lower conductive layer 12A, and a connection hole 22 formed within the dielectric layer 14 for electrically connecting an upper conductive layer to be formed on the dielectric layer with the lower conductive layer 12A. The connection hole 22 is composed of first contact layers 30A and 30B made of Ti system material formed on a bottom surface of the connection hole, a second contact layer 32 formed on the first contact layers, and a tungsten plug 20A deposited within the connection hole. The first contact layers are made of a Ti layer 30A and a TiN layer 30B, and the second layer 32 is made of tungsten.

Incidentally, in the third embodiment, the first contact layers 30A and 30B and the second contact layer 32 are also formed on a side wall of the connection hole 22. In embodiment 3, the base 10A is a silicon semiconductor substrate, and the lower conductive layer 12A is specifically an impurity material diffusion region formed on the base 10A. The method for producing the semiconductor device according to the third embodiment will now be described with reference to FIGS. 8A to 8C.

STEP 300

First of all, a dielectric layer 14 having a thickness 500 nm and made of $SiO_2$ is formed by, for example, a CVD method in the base 10A on which the lower conductive layer 12A has been formed. Subsequently, an opening portion 16 is formed on the dielectric layer 14 on the lower conductive layer 12A by, for example, photo-lithography and reactive ion etching (RIE) (see FIG. 8A).

STEP 310

Figure 8A:
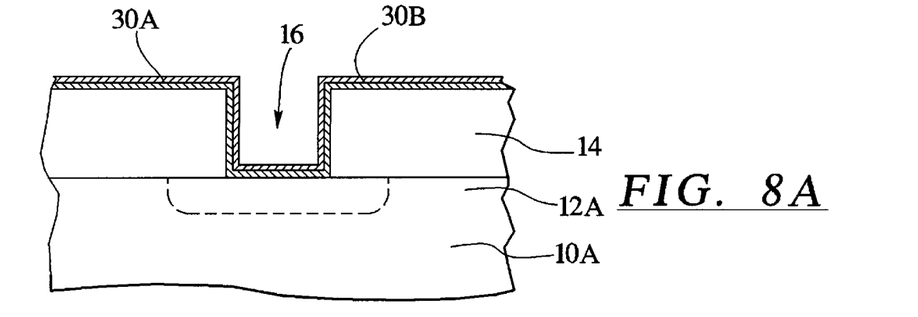
FIG. 8A is a schematic fragmentary cross-sectional view showing the semiconductor device in a first manufacture step for illustrating a method for producing the semiconductor device according to a third embodiment.

Thereafter, first contact layers 30A and 30B are formed on the dielectric layer 14 and in the opening portion 16 by, for example, a sputtering method (see FIG. 8A). The first contact layers are formed, from the lower side, of a two-layer structure of the Ti layer 30A/TiN layer 30B. For example, the conditions for sputtering are given as follows:

Formation of Ti Layer

Target: Ti

Gas Used: argon gas

Gas Pressure: 0.5 Pa (4 mTorr)
Power: 2 kW
Formation of TiN layer
Target: Ti
Gas Used: nitrogen gas
Gas Pressure: 1.1 Pa (8 mTorr)
Power: 6 kW The contact layers are formed by sputtering in a region of the base as shown in FIG. 1A. In embodiment 3, the next step is carried out under the condition that the first contact layers 30A and 30B are formed over the entire surface of the dielectric layer including the opening portion 16.

STEP 320

Figure 8B:
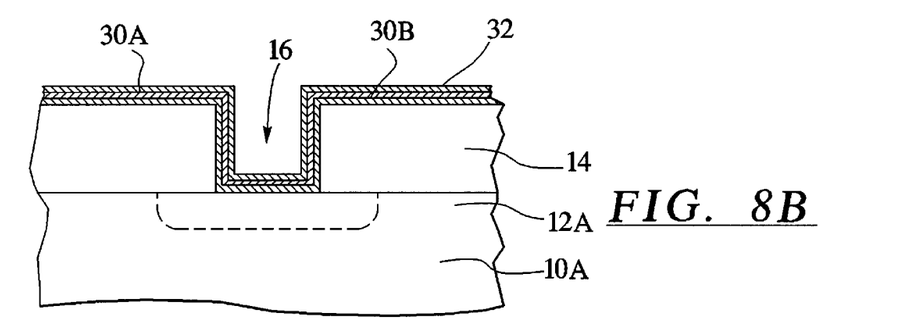
FIG. 8B is another schematic fragmentary cross-sectional view showing the semiconductor device in a second manufacture step for illustrating the method for producing the semiconductor device according to the third embodiment.

Subsequently, a second contact layer 32 is formed over the entire surface (see FIG. 8B). Namely, the second contact layer 32 is formed by the sputtering method on the first contact layers 30A and 30B that have been formed over the entire surface of the dielectric layer 14 including the opening portion 16. In the third embodiment, the second contact layer 32 is made of tungsten. For instance, the sputtering condition is given as follows:

Target: W
Gas Used: argon
Gas Pressure: 1.6 Pa (12 mTorr)
Power: 2 kW

STEP 330

Figure 8C:
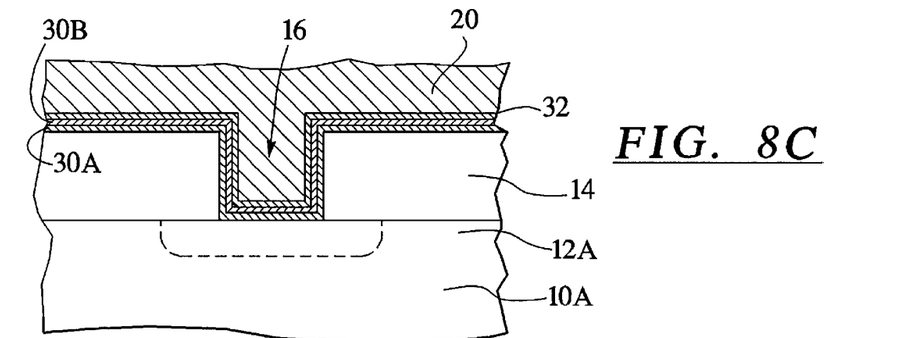
FIG. 8C is still another schematic fragmentary cross-sectional view showing the semiconductor device in a third manufacture step for illustrating the method for producing the semiconductor device according to the third embodiment.

Subsequently, a tungsten layer 20 is deposited through a chemical vapor deposition on the contact layer 32 including the opening portion 16 (see FIG. 8C). The tungsten layer 20 is formed by a blanket tungsten CVD method. At this time, the region of the base where the contact layer is not formed is covered by the covering jig. As shown in FIG. 1B, not only the region of the base where the contact layer is not formed but also a part of the base where the contact layer is formed are covered by the covering jig. For instance, the conditions for the blanket tungsten CVD method are selected in the same way as in the first embodiment.

In the first step of the nucleation step, no or very little tungsten nuclear material is formed in the region of the substrate that is covered by the covering jig including the region not covered by the second contact layer. In the second step of the high speed growth step, the deposition of the tungsten is rapidly advanced on the second contact layer covered by the covering jig. As a result, the diffusion of $WF_6$ or F that has been generated by the decomposition of $WF_6$ is suppressed on the TiN layer 30B that forms the first contact layer. Accordingly, there is no risk that the contact layer would be separated from the dielectric layer.

STEP 340

Subsequently, the respective layers formed on the dielectric layer 14 (i.e., the tungsten layer 20, the second contact layer 32 and the first contact layers 30A and 30B in the third embodiment) are removed from the dielectric layer 14 so that the tungsten plug 20A and the first and second contact layers 30A, 30B and 32 are left in the opening portion to form the connection hole 22. Parts of the tungsten layer 20 and the first and second contact layers 30A, 30B and 32 may be left on the dielectric layer 14 as desired. Thus, the semiconductor device shown in FIG. 7 is produced. Furthermore, an upper conductive layer made of, for example, Al system alloy is formed by the sputtering method or the like on the dielectric layer of the semiconductor device.

In the first embodiment, the first layer contact layers made of Ti layers/TiN layers are used or instead it is possible to use first contact layers made of Ti layers/TiON layers.

Also, instead of tungsten, the second contact layer 32 may be made of a material that is superior in reaction property with tungsten, for example, silicon. In this case, the second contact layer made of, for example, silicon may be formed on the first contact layers through a normal CVD method. By forming the second contact layer 32 of silicon, in the second step of the high speed growth step, tungsten and silicon are reacted with each other on the second contact layer that is covered by the covering jig, resulting in formation of W. As a result, the diffusion of $WF_6$ or F that has been generated by the decomposition of $WF_6$ is suppressed to the TiN layer 30B that forms the first contact layer. Accordingly, there is no risk that the contact layer would be separated from the dielectric layer.

Embodiment 4

Embodiment 4 is a modification to the third embodiment. A difference between the fourth embodiment nd the third embodiment is that in the fourth embodiment, the first contact layer is composed, from the lower side, of two layers of Ti layer/TiON layer and the second layer is formed of TiN. Also, a distinction of the fourth embodiment over the third embodiment in the method for forming the connection hole in the semiconductor devices is that the first contact layers that are formed on the dielectric layer is to be removed before the formation of the second contact layer and the second contact layer that is formed of the TiN is to be formed through a sputtering method.

Figure 9A:
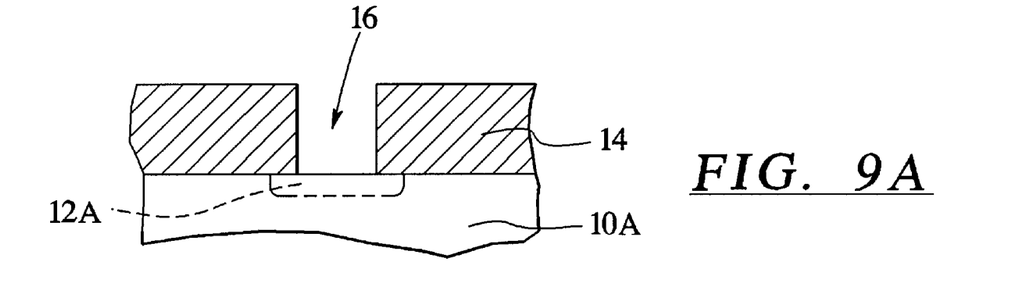
FIG. 9A is a schematic fragmentary cross-sectional view showing a semiconductor device in a first manufacture step for illustrating a method for producing the semiconductor device according to a fourth embodiment.
Figure 9B:
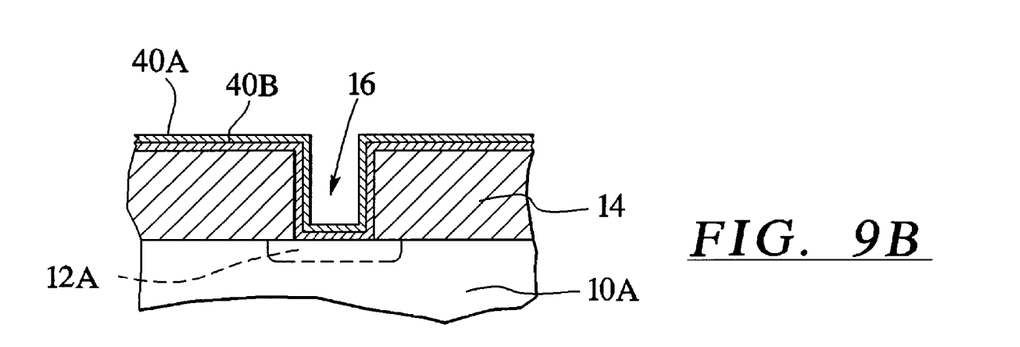
FIG. 9B is another schematic fragmentary cross-sectional view showing the semiconductor device in a second manufacture step for illustrating the method for producing the semiconductor device according to the fourth embodiment.
Figure 9C:
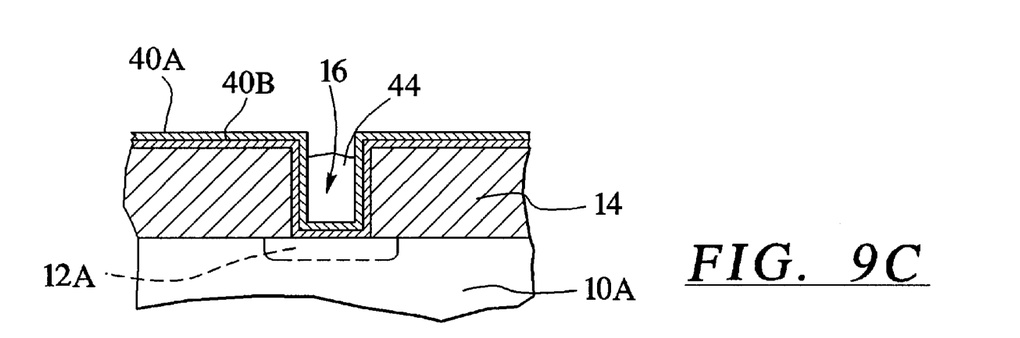
FIG. 9C is still another schematic fragmentary cross-sectional view showing the semiconductor device in a third manufacture step for illustrating the method for producing the semiconductor device according to the fourth embodiment.
Figure 10A:
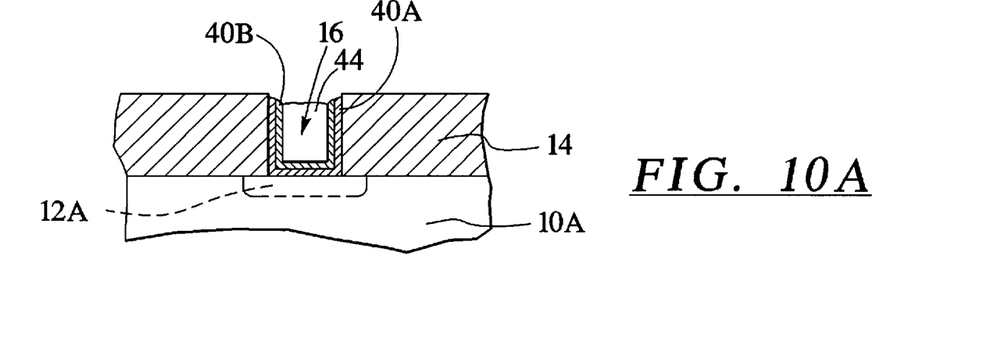
FIG. 10A is still another schematic fragmentary cross-sectional view showing the semiconductor device in a fourth manufacture step for illustrating the method for producing the semiconductor device according to the fourth embodiment.
Figure 10B:
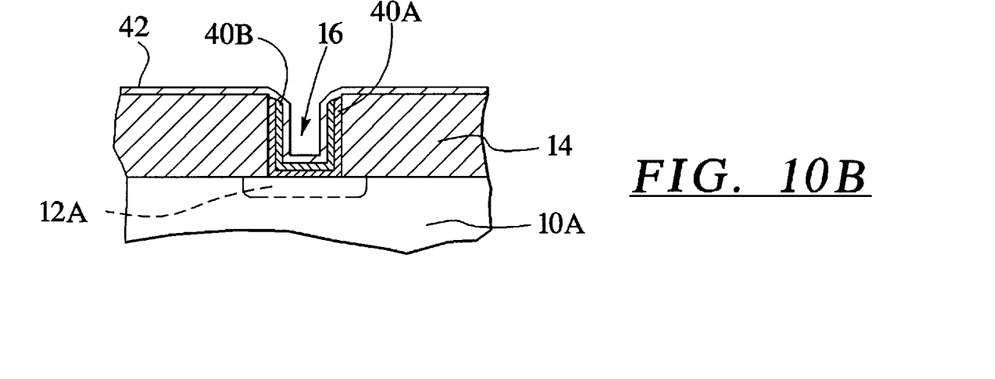
FIG. 10B is a schematic fragmentary cross-sectional view showing the semiconductor device in a fifth manufacture step for illustrating the method for producing the semiconductor device according to the fourth embodiment.
Figure 10C:
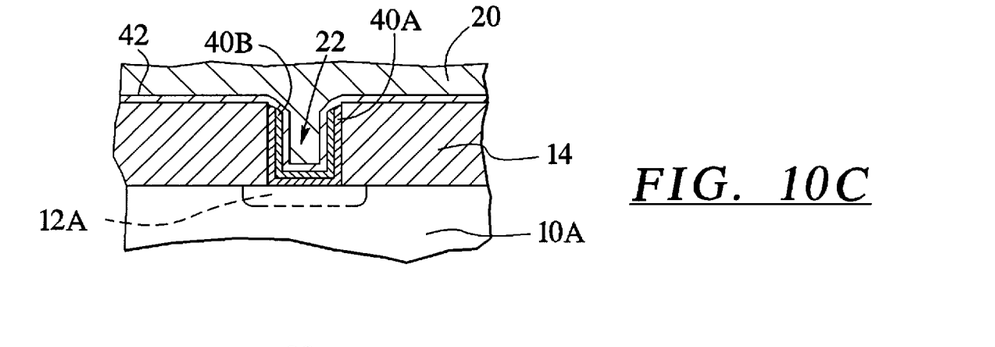
FIG. 10C is another schematic fragmentary cross-sectional view showing the semiconductor device in a sixth manufacture step for illustrating the method for producing the semiconductor device according to the fourth embodiment.
Figure 10D:
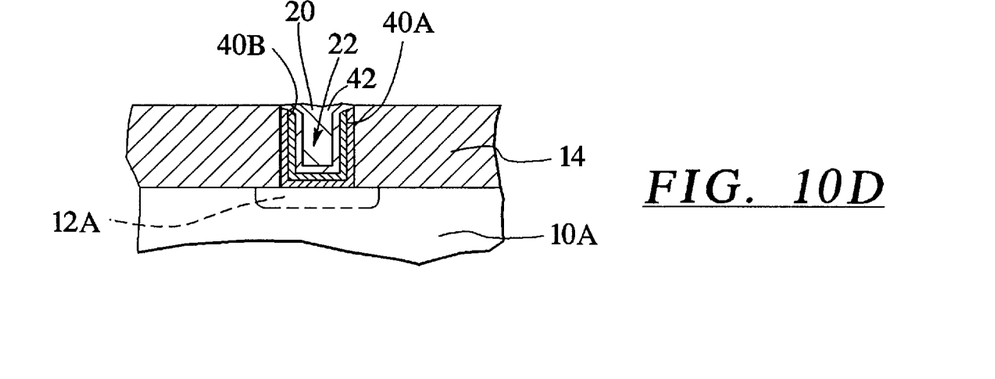
FIG. 10D is still another schematic fragmentary cross-sectional view showing the semiconductor device in a seventh manufacture step for illustrating the method for producing the semiconductor device according to the fourth embodiment.

The semiconductor device according to the fourth embodiment is composed of first contact layers 40A and 40B made of two layers of a Ti layer and a TiON layer as shown in a schematic partial cross-sectional view of FIG. 10D. The second contact layer 42 is made of TiN. The other structure is the same as that explained in conjunction with the third embodiment, and hence the detailed explanation will be omitted. The method for producing the semiconductor according to the fourth embodiment will now be described with reference to FIGS. 9A to 9C and 10A and 10D.

STEP 400

First of all, a dielectric layer 14 having a thickness 500 nm and made of $SiO_2$ is formed by, for example, a CVD method on the base 10A on which the lower conductive layer 12A has been formed. Subsequently, an opening portion 16 is formed on the dielectric layer 14 on the lower conductive layer 12A by, for example, photolithography and reactive ion etching (RIE) (see FIG. 9A).

STEP 410

Thereafter, first contact layers 40A and 40B are formed on the dielectric layer 14 and in the opening portion 16 by, for example, a sputtering method. The first contact layers are formed, from the lower side, of the two-layer structure of Ti layer 40A/TiN layer 40B (see FIG. 9B). For example, the conditions for sputtering are given as follows:

Formation of Ti Layer
Target: Ti
Gas Used: argon gas
Gas Pressure: 0.5 Pa (4 mTorr)
Power: 2 kW
Formation of TiON Layer
Target: Ti
Gas Used: nitrogen gas and oxygen gas
Gas Pressure: 1.1 Pa (8 mTorr)
Power; 6 kW The contact layers are formed by sputtering in a region of the base as shown in FIG. 1A. In embodiment 4, subsequently, the contact layers except those formed in the opening portion 16, that is, the first contact layers formed on the dielectric layers 14 are to be removed.

STEP 420

For this reason, first of all, after resist material has been applied to the overall surface, the resist material is etched back to remove the resist material on the upper side of the dielectric layer 14 and to leave the resist material 44 within the opening portion 16 (see FIG. 9C). Incidentally, a part of the resist material within the opening portion may be etched back. Namely, it is sufficient to remove the resist material layer on the upper side of the dielectric layer 14.

Thereafter, the first contact layers 40B and 40A on the dielectric layer 14 is removed usually through the RIE method (see FIG. 10A). In some cases, as shown in FIG. 10A, even if the first contact layers on the upper side of the wall of the opening portion 16 would be removed, there is no substantial problem. It is important that the first contact layers 40A and 40B formed on the bottom of the opening portion 16 are not removed. Subsequently, the resist material within the opening portion 16 is removed.

STEP 430

Subsequently, a second contact layer 42 is formed over the entire surface of the opening portion (see FIG. 10B). The second contact layer 42 is made of a TiN layer and may be formed through the same conditions as those of the sputtering method in the step 110. Thus, the second contact layer 42 is formed on the dielectric layer 14. The first contact layers 40A and 40B and the second contact portion 16 are formed in at least the bottom of the opening portion 16.

STEP 440

Subsequently, a tungsten layer 20 is deposited by a chemical vapor deposition on the contact layer 18 including the opening portion 16 (see FIG. 10C). The tungsten layer 20 is formed by a blanket tungsten CVD method. At this time, the region of the base where the contact layer is not formed is covered by the covering jig. As shown in FIG. 1B, not only the region of the base where the contact layer is not formed but also a part of the base where the contact layer is formed are covered by the covering jig. For instance, the conditions for the blanket tungsten CVD method are selected in the same way as in the first embodiment.

In the first step of the nucleation step, no or very little tungsten nuclear material is formed in the region of the substrate that is covered by the covering jig including the region not covered by the second contact layer. In the second step of the high speed growth step, since the tungsten nuclear material is not formed on the contact layer that is covered by the covering jig, $WF_6$ or F that has been generated by the decomposition of $WF_6$ is diffused in the TiN layer that forms the second contact layer 42 before the adsorption separation occurs between $WF_6$ and $H_2$ adsorbed on the contact layer. However, since the second contact layer 42 is only formed on the dielectric layer 14, there is no risk that the contact layer wold be separated from the dielectric layer.

STEP 450

Subsequently, the respective layers formed on the dielectric layer 14 (i.e., the tungsten layer 20 and the second contact layer 42 in the third embodiment) are removed from the dielectric layer 14 so that the tungsten plug 20A and the first and second contact layers 40A, 40B and 42 are left in the opening portion to form the connection hole 22. Parts of the tungsten layer 20 and the second contact layer 42 may be left on the dielectric layer 14 as desired. Thus, the semiconductor device shown in FIG. 10D is produced. Furthermore, an upper conductive layer made of, for example, Al system alloy is formed by the sputtering method or the like on the dielectric layer of the semiconductor device.

Embodiment 5

Figure 11:
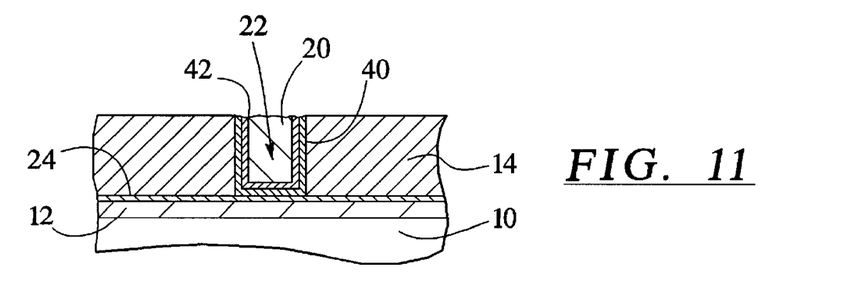
FIG. 11 is a schematic fragmentary cross-sectional view showing a connection hole in a semiconductor device according to a fifth embodiment.

FIG. 11 is a schematic partial cross-sectional view showing a semiconductor device in accordance with embodiment 5, which is a modification to the semiconductor device mentioned in conjunction with the embodiment 4. In the fourth embodiment, the first contact layer is made of the Ti layer/TiON layer, but in the fifth embodiment, instead thereof, a single layered first contact layer 40 made of TiON is used. Also, the base 10 is an interlayered dielectric layer formed on a semiconductor substrate (not shown), and the lower conductive layer is specifically a wiring layer or an electrode made of Al system alloy formed on the based 10.

Furthermore, in the same way as in the embodiment of the first embodiment, as desired, it is preferable that the conductive layer 24 that is made of TiN, TiON or TiW be formed on the lower conductive layer 12. The conductive layer 24 may be formed by a sputtering method prior to the step 400. Namely, in the case where the lower conductive layer 12 is made of Al system alloy, after the aluminum system alloy layer is deposited on the base 10 by the sputtering method, the conductive layer 24 is formed on the aluminum system alloy through the sputtering. Thereafter, the conductive layer 24 and the aluminum system alloy are selectively removed to obtain the lower conductive layer 12 and the conductive layer 24 formed on the lower conductive layer 12.

The semiconductor device according to the fifth embodiment may be produced basically using the same method as that of the semiconductor device mentioned in conjunction with the fourth embodiment, and hence, its detailed explanation will be omitted. Incidentally, it is possible to constitute the first contact layer by the two layers of Ti layer and TiON layer instead of the single layered TiON.

As described above, the present invention has been explained on the basis of the specific embodiments, but it is quite apparent that the present invention is not limited to the specific embodiments. For example, the dielectric layer 14 may be formed of well known materials such as BPSG, PSG, BSG, AsSG, PbSG, SBSG, SiN and the like in addition to $SiO_2$. After the formation of the opening 16 in the dielectric layer 14, depending upon the material that forms the dielectric layer 14, a heat treatment may be applied at a temperature of about 900° C. for about thirty minutes to the dielectric layer 14 to flatten the surface of the dielectric layer 14.

The formation of the contact layer or the first and second contact layer is possible by various types of sputtering apparatus such as a magnetron sputtering apparatus, a DC sputtering apparatus, a RF sputtering apparatus, an ECR sputtering apparatus, a bias sputtering apparatus for applying substrate bias, and the like.

According to the present invention, it is possible to prevent effectively the separation of the contact layer from the dielectric layer. Since it is unnecessary to carry out the RTA treatment after the formation of the contact layer and before effecting the blanket tungsten CVD method, there is no fear that cracks would occur in the contact layer. Furthermore, it is possible to avoid the problem that if the RTA treatment is carried out, the aluminum system alloy would be molten in the case where the lower conductive layer is made of aluminum system alloy. Also, it is possible to eliminate the problem that the contact resistance between the connection hole and the lower conductive layer wold be increased or that the contact between the connection hole and the lower conductive layer would exhibit the non-ohmic characteristics.

What is claimed is:

1. A method for producing a semiconductor device, comprising the following steps of:

forming a dielectric layer on a base on which a first conductive layer is formed;

forming an opening portion in said dielectric layer;

forming a first contact layer through a sputtering method on at least a bottom of said opening portion, said first contact layer having a single TiON layer;

removing any portions of said first contact layer formed on said dielectric layer;

forming a second contact layer over an entire exposed surface of said first contact layer, said second contact layer being formed by the sputtering method;

depositing tungsten on said second contact layer by a chemical vapor deposition method; and removing portions of the second contact layer formed on said dielectric layer while leaving a tungsten plug and said first and second contact layers within said opening portion to thereby form a via hole contact.

2. The method according to claim 1, wherein said second contact layer is made of one of tungsten and silicon.

* * * * *